United States Patent [19]  [11] 4,043,835
Hall, Jr.  [45] Aug. 23, 1977

[54] FLEXIBLE SLEEVE THERMAL PATH DEVICE FOR THERMOELECTRIC CONVERTER ELEMENT PRESSURE LOADING FORCE APPLICATION SPRING

[75] Inventor: Samuel D. Hall, Jr., Catonsville, Md.

[73] Assignee: Teledyne Isotopes, Timonium, Md.

[21] Appl. No.: 594,449

[22] Filed: July 9, 1975

[51] Int. Cl.² ............................................ H01L 35/02
[52] U.S. Cl. .................................... 136/221; 136/229
[58] Field of Search ................................ 136/221, 229

[56] References Cited
U.S. PATENT DOCUMENTS 2,988,582  6/1961  McGregor et al. .................. 136/221
3,449,172  6/1969  Dingwall ............................. 136/221

Primary Examiner—Maynard R. Wilbur
Assistant Examiner—Richard E. Berger
Attorney, Agent, or Firm—Fleit & Jacobson

[57] ABSTRACT

A flexible layered tubular sleeve which surrounds a thermoelectric element force application spring. The sleeve is electrically insulated from the thermoelectric element and provides a thermal path between the cold end junction of the thermoelectric element and a heat rejection system. The sleeve comprises a plurality of bowed flexible strips which bend outwardly when an axial compressive force is applied to the sleeve thus causing these strips to collapse. The sleeve provides a thermal path between the thermoelectric element and the heat rejection system without interfering with the operation of the force application spring.

4 Claims, 3 Drawing Figures

FLEXIBLE SLEEVE THERMAL PATH DEVICE FOR THERMOELECTRIC CONVERTER ELEMENT PRESSURE LOADING FORCE APPLICATION SPRING

BACKGROUND

The present invention relates in general to thermoelectric energy conversion cold end hardware, and more particularly to heat rejection systems thermal connection to thermoelectric conversiondevices.

As is well known, thermoelectricity functions in a manner similar to the distilling of water. Thus, if one junction of a semiconductive thermocouple is heated, electrons are "evaporated" or raised from the valence band to the conduction band. For each evaporated electron, a vacancy or hole is left behind and both the electron and the hole travel to the cold end of the thermocouple through the semiconductors and are reunited at the cold end junction. As the holes and electrons are reunited, a flow of positive current is produced at the cold end junction.

At the cold end of the thermocouple elements, helical compression springs are used to hold these elements in longitudinal compression against a hot plate. Efficient heat transfer to the heat rejection system is one of the requirements for efficient operation of a thermoelectric device and efficient heat transfer requires a good thermal path between the cold junction and the heat rejection system. As the amount of heat rejected at the cold end of the thermalcouple directly affects the efficiency of the thermoelectric generator, such efficiency can be increased by increasing the efficiency with which heat is transferred to the heat rejection system. Springs are often used to insure good thermal (and in some cases electrical) contact between the cold and hot ends of the thermocouples and the heat rejection and heat source systems. As springs present a small cross-sectional area with a long path and are in nonbonded pressure contact at both ends and must usually be made of low conductivity metals they are not adequate alone for efficient heat transfer but must be augmented in some way.

Springs are a desirable way to achieve the above loading requirements as they also will function to accommodate misalignment between the cold junction of the thermocouple and the heat rejection system. Furthermore, they will compensate for the unavoidable manufacturing tolerances which accrue during the fabrication of a generator. Thus helical compression springs are one useful way of applying the required T/E element end loads in thermoelectric generators.

Some attempts have been made to overcome the drawback of the limited heat transfer path of springs. These attempts are generally directed to providing heat transfer paths between a thermoelectric cold end junction and a heat rejection system, which paths are in addition to that path provided by a compression spring. One such device is shown in Spira et al. U.S. Pat. No. 3,266,944, wherein a flexible braid or conductor is positioned axially within the spring and maintains positive electrical and heat exchange relation between spring seats positioned on opposite ends of cold end compression springs. However, the cross-sectional area of the conductor shown in the Spira device is restricted by the interior diameter of the spring as well as the fact that it is formed of many fine wires and thus the heat transfer path between the thermoelectric generator cold end junction and the heat rejection system is limited. Other known devices generally circulate a coolant between the generator cold end junction and the heat rejection system in order to increase heat transfer therebetween, or require volumes and densities of materials greatly in excess of those necessary for the flexible sleeve to achieve similar results.

The present invention bypasses the poor thermal path provided by the loading spring and provides a highly conductive one between the thermoelectric element cold junction and the heat rejection system. It is comprised of a flexible sleeve device positioned around the thermoelectric loading spring to provide the good heat transfer path. The flexible sleeve is bonded to the heat rejection system, electrically insulated from the thermoelectric element cold end conductor and is longitudinally collapsible in such a manner as to apply only a negligible load to the thermoelectric element and thus not interfere with the operation of the loading spring, or add to or subtract from its loading force on the element.

BRIEF SUMMARY OF THE INVENTION

Briefly, the means of thermally connecting the cold junction of a thermoelectric element of a thermoelectric generator to its heat rejection system comprises a flexible sleeve surrounding a helical compression spring. The flexible sleeve provides the major heat transfer path, the heat transfer path provided by the spring being negligible. The spring operates independently within the sleeve. Therefore, a highly conductive thermal path is provided around the necessary force application spring.

The flexible sleeve is formed by wrapping a plurality of layers of heat conductive foil into a cylinder, bonding the layers together at the ends thereof, and providing a plurality of longitudinal slits within the length in the thus-formed cylinder, so that the cylinder ends are complete rings connected by longitudinal strips. Because only a small quantity of material is required for adequate heat transfer in the sleeve wrapping, the weight of the sleeve can be maintained at desirable levels. The cylinder wall located between the longitudinal slits is bowed outwardly of the cylinder to form a plurality of layered weak collapsing strips so that axial compressive force applied at both ends of the cylinder will cause the cylinder to collapse, as the contained spring is deflected to provide load, without interference with the operation of the spring. The sleeve is bonded at one end to an end cap which is in turn bonded to a wafer of electrical insulation held against the thermoelectric element cold end conductor by the spring load which it is insulated therefrom, and at the other end is bonded in a sleeve seat in the heat rejection system wall. The bonds between the end cap wafer and the cap, the end cap and flexible sleeve and the bond between the sleeve and the heat rejection system wall are thermally conductive bonds, thus the sleeve is electrically insulated from the thermoelectric circuit, yet provides a thermal path between the elements in the thermopile and the heat rejection system.

Being flexible, the sleeve will maintain thermal contact between the thermoelectric element and the heat rejection system, even though there is misalignment between that element and the heat rejection system. The misalignment can be either rectilinear or angular and the sleeve will maintain the thermal contact. Because the sleeve is flexible, manufacturing tolerances may be accommodated, as the flexibility of the sleeve will make up for minor variations.

It is therefore a primary object of the present invention to provide a flexible heat conductive path for efficiently conducting heat around a thermoelectric element force application helical compression spring.

It is another object of the present invention to provide a thermal path around a force application helical compression spring which will not interfere with the functioning of that force application spring.

It is yet another object of the present invention to provide a flexible thermal path past a thermoelectric force application spring which is electrically isolated from the thermoelectric circuit.

It is still another object of the present invention to provide a flexible thermal path past a thermoelectric element force application spring which will accommodate manufacturing normal tolerances that result from the fabrication of the thermoelectric generator.

It is further object of the present invention to provide a flexible thermally conductive path past a thermoelectric element force application spring or springs of cylindrical geometry which can accommodate misalignment in all directions between the thermoelectric element and the heat rejection system.

These and other objects of the present invention, as well as many of the attendant advantages thereof, will become more readily apparent when reference is made to the following description taken in conjunction with the accompanying drawings.

DESCRIPTION OF THE PREFERRED EMBODIMENTS

Figure 1:
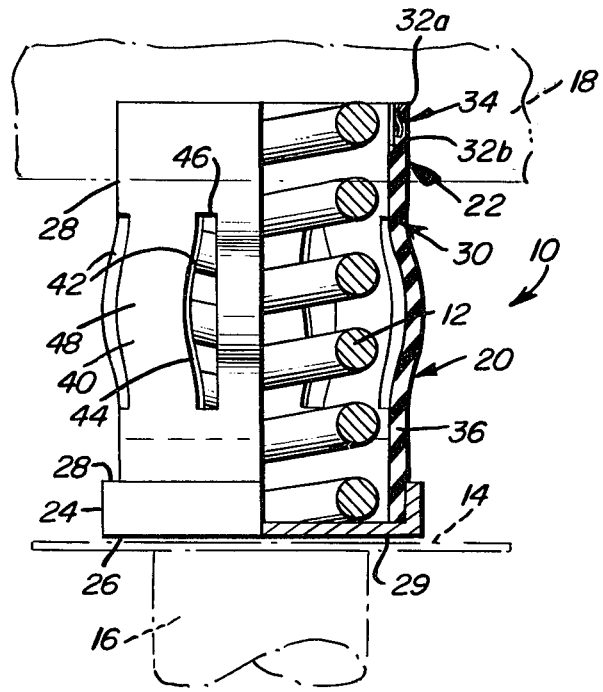
FIG. 1 illustrates the cold end hardware of a thermoelectric generator comprising a flexible thermally conductive path between the heat rejection system and the thermopile cold end in accordance with the teachings of the present invention.

Shown in FIG. 1 is a flexible connecting means 10, which provides a thermal path around a spring 12, positioned between cold strap 14 of the thermoelectric element 16 and heat rejection system 18 to remove the waste heat of conversion from the thermoelectric element while simultaneously accommodating construction and thermal dimensional variations in all directions. The connecting means 10 comprises an elongated flexible sleeve 20 surrounding the spring 12 and connected at one end to a sleeve seat 22 in heat rejection system 18 and at the other end to end cap 24, which is bonded to an insulation wafer or coating 26. Sleeve 20 is bonded to sleeve 22, wafer 26 and to end cap 24 by bonded connections 28 which are conductive thermally.

End cap 24 may be manufactured from a machined round bar of aluminum alloy having the internal surfaces thereof copper plated and tinned with 100% tin. The outer face 29 of the end cap 24 is bonded to an electrical insulating material, such as a metalized BeO wafer to provide thermoelectric circuit isolation from the connecting cold strap while providing good thermal contact between the cold strap 14 and the sleeve 20. The bonded connection 28 is preferably heat fused solder of 0.002 to 0.004 inches thick placed between the copper platings, however, other suitable bonded connections can be used.

Spring 12 is preferably made from high temperature resistant wire installed at load and deflected to operating length. Springs of any size may be used with suitably designed flexible sleeves. The sleeve recess in the heat reject system wall and the sleeve cap provide spring seats to exert longitudinal expansion forces required. For proper function of the thermoelectric elements 16.

As shown in FIG. 1, flexible sleeve 20 comprises a tube 30 formed by wrapping many layers such as shown by numerals 32a and 32b, of foil such as aluminum foil, into a cylindrical form. The layers 32a and 32b are bonded together at ends 34 (shown at both ends) and after slotting and forming a flexiblewall 36. The wall 36 provides a good heat transfer path between cold strap 14 and heat rejection system 18, while remaining flexible and thus not interfering with the operation of spring 12. The heat transfer properties of sleeve 20 are dependent on the heat transfer properties of the wall 36, which in turn, can be varied by the type of foil used and the thickness thereof as well as the number of wraps. For example, the wall 36 can be formed from 20 layers of aluminum alloy foil each 0.001 inch thick.

Figure 2:
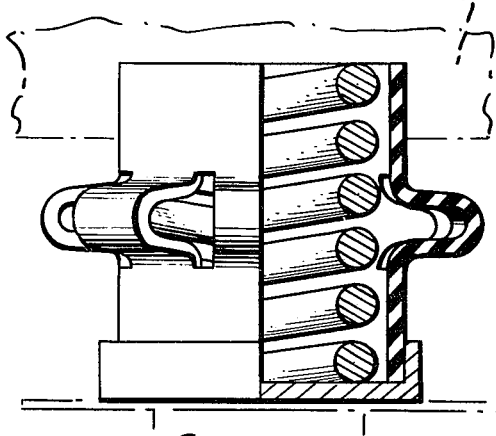
FIG. 2 illustrates the device shown in FIG. 1 in an installed load position.

Collapsing strips 40 are formed between longitudinally running slits 42 cut in the wall 36 and enable the sleeve 20 to be longitudinally collapsible. The slits 42 run longitudinally along the sleeve 20 from a position at or near either end 34 for an axial distance along the sleeve determined according to requirements to be discussed below. The slits or cuts 42 may have any end shape, having longitudinal edges 44 and ends 46. The collapsing strips 40 are flattened over their entire length 48 thereof, and slightly bowed outwardly thereat as shown in FIG. 1. Thus, when axial compressive force is applied to both ends of flexible sleeve 20, the collapsing strips 40 will bow outwardly into the configuration shown in FIG. 2 and the sleeve will collapse axially. Because of the flexibility of the layered strips 40, the sleeve will collapse without interfering with the movement of spring 12. Furthermore, as shown in FIG. 2, when the spring is collapsed under installed load, some misalignment between heat rejection system 18 and thermoelectric element 16 may be tolerated without interfering with the thermal path between these two elements as both the spring and flexible sleeve are laterally and angularly flexible. The flexible sleeve bends in all directions to maintain the continuity of the thermal path between the thermoelectric element and the heat rejection system, even when misalignment between these two elements is present.

Figure 3:
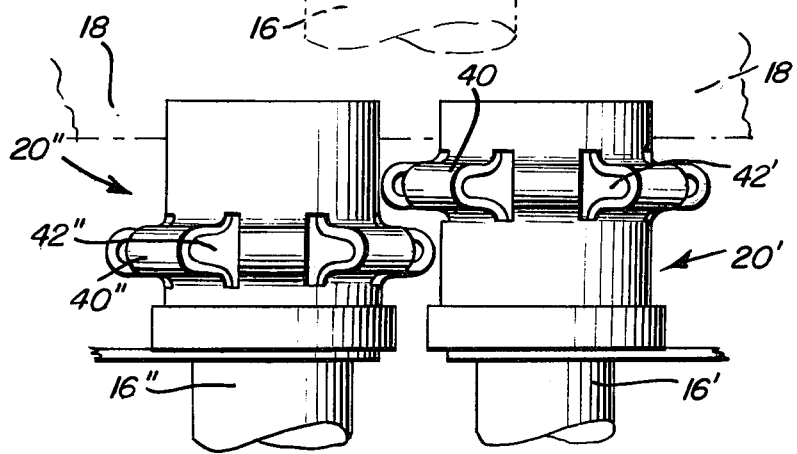
FIG. 3 illustrates the device of the present invention installed on two adjacent thermoelectric elements.

Shown in FIG. 3 is a system comprising a P-type thermoelectric element 16' adjacent an N-type thermoelectric element 16". As shown in FIG. 3, slits 42' and 42", which form collapsing strips in the cylinder wall 40' and 40", respectively, are positioned in an alternating fashion on the sleeves 20' and 20" to allow each set of collapsing ribs to flex outwardly without interfering with the outward flex of the collapsing strips of an adjacent sleeve. A plurality of thermoelectric elements can thus be placed in a closely spaced side-by-side relationship.

The flexible sleeve 20 also allows angular and lateral misalignment between thermoelectric element 16 and heat rejection system 18. Spring 12 is generally a helical spring and is flexible in a manner similar to the flexibility of the sleeve 20 and thus the movement of the spring is not inhibited by the flexible sleeve. Since the spring is contained within the flexible sleeve, the spring moves with the sleeve and provides some restraint to excessive misalignment with might cause deformation of the sleeve.

In operation, one end of the sleeve is (thermally) conductively bonded to end cap 24 and the assembly placed around spring 12. The end cap has previously been (thermally) bonded to the metalized electrical isolation wafer. The sleeve is then (thermally) conductively bonded into sleeve seat 22 of the heat rejection system 18. At a zero load condition, the connecting means 10 assumes the shape shown in FIG. 1, and at an installed load condition, the connecting means assumes the configuration shown in FIGS. 2 and 3 with the collapsing strips bowed outwardly. Upon release of the installing force, the connecting means will resume the shape shown in FIG. 1.

Alternate embodiments of the connecting means include variations in the number and shape of the slits 42, as well as the means for bonding the sleeve to the end cap and/or the heat rejection system 18 as well as the absolute size.

Although the present invention hass been described with reference to a preferred embodiment, various changes and modifications will be evident to those skilled in the art which do not depart from the inventive concepts taught herein.

I claim:

1. A device for augmenting transfer of heat between a thermoelectric element cold end and a heat rejection system around a thermoelectric force application spring comprising:

a thermally conductive flexible sleeve for surrounding the force application spring with a highly conductive heat transfer path between the thermoelectric element and the heat rejection system, said sleeve comprising a cylindrical slotted tube comprising a plurality of layers of foil bonded together at the ends thereof and having a plurality of collapsible flat strips defined between longitudinal slits in the side walls of said cylindrical tube, which collapsing strips bow outwardly of the tube when an axial compressive force is applied to the ends of said tube to allow the sleeve to be longitudinally collapsible and to decrease the axial length thereof without interfering with the application of force by the force application spring; and an end cap on said sleeve assembly located adjacent to and electrically insulated from said thermoelectric cold end.

2. A device as defined in claim 1 wherein said collapsing strips are flattened in cross-section thereof, and with respect to the cylinder, assume a slightly outwardly bow prior to the application of axially directed force to the ends of said cylinder.

3. A device as defined in claim 1, wherein said end cap is conductively bonded to the sleeve and said end cap is faced with a bonded electrical insulation surface at the surface contacting said thermoelectric element.

4. A device as defined in claim 1, wherein said sleeve is conductively bonded to a sleeve located in the heat rejection system.

* * * * *

UNITED STATES PATENT AND TRADEMARK OFFICE
CERTIFICATE OF CORRECTION

PATENT NO. : 4,043,835
DATED : August 23, 1977
INVENTOR(S) : Samuel D. Hall, Jr.

It is certified that error appears in the above-identified patent and that said Letters Patent are hereby corrected as shown below:

Column 3, line 55, should read -- sleeve seat 22, end cap 24 and indirectly to wafter 26 by bonded con- --;
line 58, after "internal" add -- flange and wafer side--;
line 67, change "platings" to -- surfaces --;

Column 4, line 14, after "forming" insert -- produce -- and change "flexiblewall" to -- flexible wall --;

Column 5, line 8, change "sleeveis" to -- sleeve is --;

Column 6, line 29, after "sleeve" add -- or recess --.

Signed and Sealed this

Twenty-first Day of February 1978

[SEAL]

Attest:

RUTH C. MASON
Attesting Officer

LUTRELLE F. PARKER
Acting Commissioner of Patents and Trademarks